(12) United States Patent
Kamphuis et al.

(10) Patent No.: US 9,379,071 B2
(45) Date of Patent: Jun. 28, 2016

(54) SINGLE INLINE NO-LEAD SEMICONDUCTOR PACKAGE

(71) Applicant: NXP B.V., Eindhoven (NL)

(72) Inventors: Tonny Kamphuis, Lent (NL); Jan Gulpen, Nijmegen (NL); Jan Willem Bergman, Veghel (NL)

(73) Assignee: NXP B.V., Eindhoven (NL)

( * ) Notice: Subject to any disclaimer, the term of this patent is extended or adjusted under 35 U.S.C. 154(b) by 15 days.

(21) Appl. No.: 14/255,935

(22) Filed: Apr. 17, 2014

(65) Prior Publication Data

US 2015/0303156 A1 Oct. 22, 2015

(51) Int. Cl.
| | |
|---|---|
| *H01L 23/48* | (2006.01) |
| *H01L 23/00* | (2006.01) |
| *H01L 23/29* | (2006.01) |
| *H01L 23/31* | (2006.01) |

(52) U.S. Cl.
CPC .............. *H01L 24/06* (2013.01); *H01L 23/293* (2013.01); *H01L 23/3114* (2013.01); *H01L 2224/05005* (2013.01); *H01L 2224/05012* (2013.01); *H01L 2224/0612* (2013.01); *H01L 2924/014* (2013.01); *H01L 2924/0105* (2013.01); *H01L 2924/01029* (2013.01); *H01L 2924/10253* (2013.01)

(58) Field of Classification Search
USPC ............ 257/697, 772, 779, E23.015, E23.02, 257/E23.023–E23.079, E21.508–E21.509, 257/E21.519, 100, 433, 434, 667, 787–796, 257/E31.117–E31.118, E51.02, 257/E23.116–E23.14; 438/612–617, 3, 28, 438/66, 67, 107, 109, 406, 455–459
See application file for complete search history.

(56) References Cited

U.S. PATENT DOCUMENTS

| | | | | |
|---|---|---|---|---|
| 2002/0079592 | A1* | 6/2002 | Lo ..................... | H01L 23/3107 257/778 |
| 2011/0244629 | A1* | 10/2011 | Gong ................. | H01L 21/4828 438/112 |
| 2013/0273731 | A1 | 10/2013 | Gulpen et al. | |
| 2014/0091458 | A1 | 4/2014 | Van Gemert et al. | |
| 2014/0183747 | A1* | 7/2014 | Samoilov ............... | H01L 24/81 257/773 |
| 2014/0306330 | A1* | 10/2014 | Williams .......... | H01L 23/49541 257/675 |

OTHER PUBLICATIONS

Jackson et al, "MicroCSP Wafer Level Chip Scale Package", Application Note, Analog Devices, Report AN-617, (2007), pp. 1-12.
"Wafer-Level Chip-Scale Package (WLCSP) at Fairchild Semiconductor", Fairchild Semiconductor, Application Note, Report AN-5075, Revision 1.0.0, (Aug. 5, 2013), pp. 1-13.
"Wafer-Level Chip Scale Package (WLCSP)", Freescale Semiconductor, Application Note, Report AN3846, Revision 3.0, (May 2012), pp. 1-15.

* cited by examiner

*Primary Examiner* — Dao H Nguyen
*Assistant Examiner* — Tram H Nguyen (57) ABSTRACT

Embodiments of a packaged semiconductor device with no leads are disclosed. One embodiment includes a semiconductor chip and a no leads package structure defining a boundary and having a bottom surface and includes three or more pads exposed at the bottom surface of the package structure. Each of the pads is located in a single inline row.

19 Claims, 10 Drawing Sheets

SINGLE INLINE NO-LEAD SEMICONDUCTOR PACKAGE

The semiconductor packaging industry continues to seek to reduce the size of semiconductor packages. A recent trend in the industry is to use surface-mount technology (SMT) as a replacement for conventional plated-through-hole (PTH) technology. SMT offers several distinct advantages over PTH technology, such as greater packaging density, shorter interconnection lengths, and easier automation. The relatively new flat leadless or no-lead package structure, in which space-consuming outer leads protruding laterally out of a package, are eliminated allow for smaller semiconductor packages. Instead, external electrode pads are provided on a surface of the semiconductor packages for connection to a printed circuit board. Of critical importance is the footprint of the semiconductor packages on the printed circuit board. As the footprint of an individual semiconductor package is reduced the size of the printed circuit board (PCB) can be reduced and/or more area is freed for other semiconductor packages on the printed circuit board. The size of the electronic device can be reduced accordingly.

As the size of flat leadless or no-lead packages is driven down, it is still important to maintain adequate space between the pads (or terminals) to reduce or prevent electric interference between the pads. For example, it is desirable to maximize the distance between the exposed pads on the bottom surface of the packages while still providing enough pad surface area to enable a reliable physical and electrical connection to the printed circuit board. Adequate space between the pads is also constrained by mounting technology. In the conventional plated-through-hole technology, mounting is relatively simple as the leads on the package fit into holes in the circuit board. Plated-through-hole mounting uses well established soldering methods. The leads provide added mechanical strength and mechanical integrity. For no-lead packages, a solder paste may be applied to the printed circuit board and the package is connected to the board through the solder. The application of solder paste may affect the size of a package as the solder lands on a circuit board are constrained in both size and separation.

The smallest conventional leadless (or no leads) packages employ two rows of pads or terminals. A package with six pads employs two rows of three pads and a package with eight pads employs two rows of four pads. In such conventional packages the distance between the two lines of pads is larger than the pitch of the pads along a row. The size of the electronic device on the PCB, is also determined by the screen print technology, which requires a wide area around the device to allow formation of a meniscus in the solder, that is capable of inspection. As such the footprint of a dual in line leadless device has a relatively large area.

Embodiments of a packaged semiconductor device with a single inline row of pads are disclosed. One embodiment of a semiconductor device includes a semiconductor chip and a leadless package structure defining a boundary and having a bottom surface. The leadless package structure includes three or more pads exposed at the bottom surface of the package structure. Each of the pads or terminals is located in a single inline row. Because the pads are located in a single row, the separation distance and pitch between the pads is critical in only a single direction. Additionally, in applications where only an odd number of pads are necessary in a package, a single inline package is more space/area efficient than a dual inline package (e.g. a 2×3 array or a 2×4 array) and will limit the footprint of the package on a printed circuit board. In an embodiment, the leadless package structure defines a rectangular bottom boundary. In a further embodiment, the width of the rectangular bottom boundary of the leadless package structure is approximately 0.45 mm. In other embodiments, the width may be between approximately 0.4 mm and 0.5 mm. In some embodiments, the width may be larger 0.5 mm depending on the size and shape of the pads. In some embodiments, the width of the bottom boundary of the leadless package structure is the same as the width of the pads. In some embodiments, the width of the bottom boundary is larger than the width of the pads. In an embodiment, the pitch between each pad (e.g. as measured from the pad centers) is approximately 0.35 mm. In another embodiment, the pitch between each pad is approximately 0.30 mm.

In some embodiments, the leadless package structure has four side surfaces (two length side surfaces and two end side surfaces) adjacent to the bottom surface. In an embodiment, each of the plurality of pads exposed on the bottom surface is side wettable (i.e., the plurality of pads is exposed on a side surface in addition to the bottom surface). In an embodiment, each of the pads is side wettable and exposed on a first length side surface of the leadless package. Thus, each and every pad of the leadless package is exposed on a side surface of the leadless package, which allows for easier inspection of the mounting of the leadless package structure to the printed circuit board. For example, the inspection may only require looking at a single side of the leadless package structure. In an embodiment, each of the pads is side wettable on two side surfaces. In an embodiment, each pad is exposed on a first length side surface of the leadless package and on a second length side surface of the leadless package. Thus, the leadless package would allow inspection of each pad or terminal on more than one side. In an embodiment, only a portion of the pads on a length side surface are side wettable.

In an embodiment, the two end pads located at the two ends of the single inline row of pads are each side wettable, each pad being exposed on opposite end side surfaces of the leadless package structure. In an embodiment, only one of the two end pads located at the end of the single inline row of pads is side wettable, the pad being exposed on an end side surface of the leadless package.

In an embodiment, each of the plurality of pads is a polygonal shape. The shape of the pads may be any shape including but not limited to square, triangle, rectangle, trapezoid, quadrilateral, or other polygonal shape. The shape may be optimized to provide sufficient area to provide a reliable connection and leave enough space between pads to reduce the possibility of shorting the connections. In an embodiment, the pads are irregular shapes and may be any shape capable of creating a connection through the pads. In an embodiment, the each of the plurality of pads is located in a single inline row devoid of any pads on the bottom surface outside the single inline row. In an embodiment, each of the plurality of pads are located in a line along the bottom surface of the package. In an embodiment, the line is defined as a line running through a geometric center (i.e., centroid) of a pad at the end of the row of pads and crossing each other pad in the row. In an embodiment, the outer edges of the plurality of pads are collinear.

Other aspects in accordance with the invention will become apparent from the following detailed description, taken in conjunction with the accompanying drawings, illustrated by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Flat no-lead or leadless packages, such as quad-flat no-lead (QFN) packages, dual-flat no-lead (DFN packages, and small-outline no-lead (SON) packages are used to physically and electrically connect semiconductor chips, i.e., integrated circuit (IC) devices, to printed circuit boards. These flat leadless or no-lead packaged semiconductor devices are connected to printed circuit boards using surface mount techniques (e.g., SMT) and without through-holes in the printed circuit boards. For example, pads at the bottom surface of such a packaged semiconductor device are soldered to corresponding connection points on a printed circuit board to form a physical connection to the printed circuit board and to form electrical connections to the packaged semiconductor chip. As used herein, a "pad" of a packaged semiconductor device refers to an area of a conductive member that is exposed at the bottom surface of a flat leadless package. Other terms that are commonly used to describe pads of a packaged semiconductor device include, for example, terminals, leads, pins, landings, and landing pads. The term "pad" is used herein for consistency although other terms, such as the terms described above, could be used to reference the same or similar elements.

As the size of flat no-lead or leadless packages is driven down, it is important to maintain adequate space between the pads to reduce or prevent electric interference between the pads while still providing enough pad surface area to enable reliable physical and electrical connection to a printed circuit board. For example, it is desirable to maximize the distance between the exposed pads on the bottom surface of the packages while maintaining a desired pad surface area. Additionally, the distance between pads or the pitch is also affected by the mounting of the package to a printed circuit board. The separation distance in between rows of pads in a two dimensional array of pads is larger than the separation distance in between the pads within a row. In one process of surface mounting no-leads packages to a printed circuit board, a thin screen is placed on the circuit board covering portions of the board and exposing solder lands. Solder paste is then applied to the exposed solder lands. In many cases the direction the solder paste is applied is critical. For a two dimensional arrayed package this may result in larger separation distances in between rows of pads as opposed to separation distances within a row of pads. For a single inline leadless package there is only a single critical direction. Additionally, the solder land on a printed circuit board for two dimensional arrays is larger than the small packages mounted on circuit board. The size of the electronic device on the PCB, is also determined by the screen print technology, which requires a wide area around the device to allow formation of a meniscus in the solder, that is capable of inspection. As such the footprint of a dual in line leadless device has a relatively large area. With only a single critical direction for a single inline leadless package, the size of lands may be much less. Additionally, where an odd number of connections is necessary for an application, a two dimensional array will have an extra pad and further increase the footprint of the package, whereas a single row leadless package may easily incorporate an odd number of pads. A single inline row of pads reduces the footprint of a package.

Figure 1:
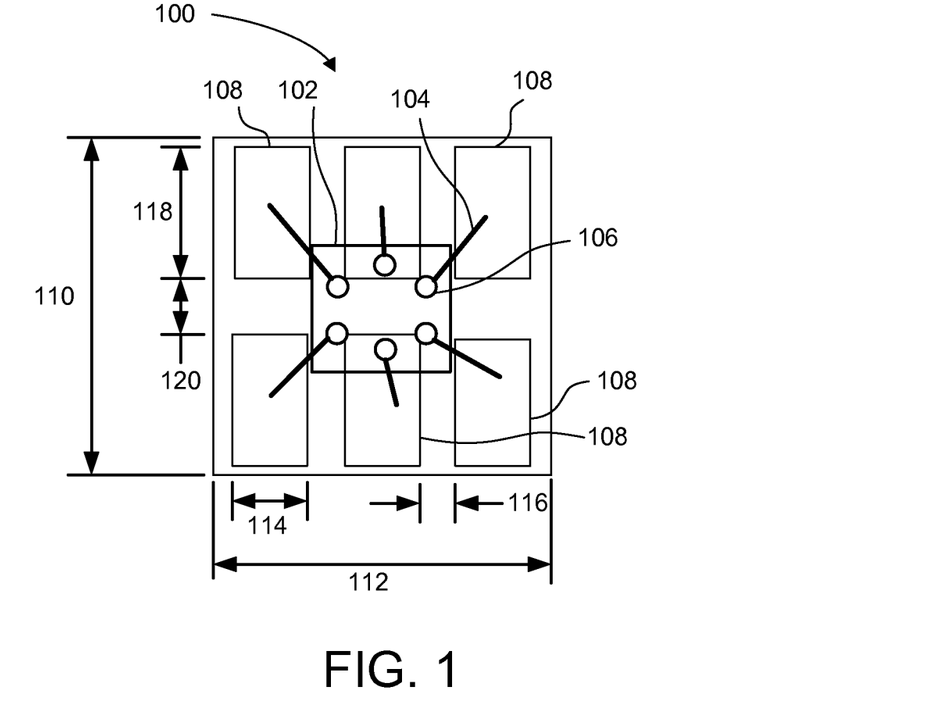
FIG. 1 depicts a conventional six pad leadless package in a two by three array with a semiconductor chip and conductive wires connecting the conductive pads of the semiconductor chip.

FIG. 1 depicts a top plan view of a traditional six pad leadless package 100 in a two by three array with a semiconductor chip 102 and conductive wires 104 connecting the conductive pads 106 of the semiconductor chip 102 to the leadframe terminals 108. The illustrated package 100 has six terminals 108 arranged in a two by three array. The footprint of the package 100 is determined by the overall width 110 and the overall length 112 of the package 100. The overall length 112 of the package 100 is affected by the length 114 of the terminals 108 and the necessary lengthwise separation distance 116 between the terminals 108. The overall width 110 of the package 100 is affected by the width 118 of the terminals 108 and the widthwise separation distance 120. The widthwise separation distance 120 is greater than the lengthwise separation distance 116 for reasons of applying solder paste to a printed circuit board and surface mounting of the package to the printed circuit board. A dual inline package results in two critical dimensions that affect the footprint of the package.

Figure 2A:
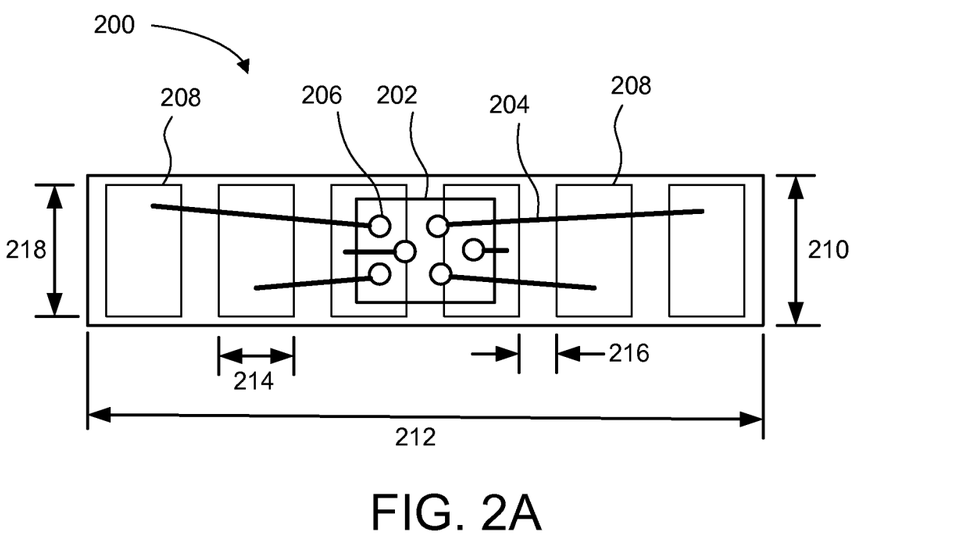
FIG. 2A depicts a six pad single inline leadless package with a semiconductor chip and conductive wires connecting the conductive pads of the semiconductor chip.

FIG. 2A depicts a top plan view of a six terminal single inline leadless package 200 with a semiconductor chip 202 and conductive wires 204 connecting the conductive pads 206 of the semiconductor chip 202 to leadframe terminals 208. The leadframe terminals 208 are electrically connected to respective pads of the leadless package structure exposed on the bottom side of the leadless package. The illustrated package 200 has six terminals 208 arranged in a single inline row. The leadframe terminals 208 are illustrated to correspond with exposed pads on the bottom side of the leadless package. The footprint of the package 200 is determined by the overall width 210 and the overall length 212 of the package 200. The overall length 212 of the package 200 is affected by the length 214 of the terminals 208 and the lengthwise separation distance 216 between the terminals 208. The overall width 210 of the package 200 is only affected by the width 218 of the terminals. The single inline row of terminals 208 allow for a smaller footprint package with six terminals 208 than the two by three array of package 100.

In small outline no-leads packaging, a semiconductor chip is physically attached to the leadframe by, for example, an adhesive, and conductive pads of the semiconductor chip are electrically connected to the leadframe by, for example, wire bonding. The conductive wires electrically connect the conductive pads of the semiconductor chip to the leadframe and the leadframe is electrically connected to the respective pads of the packaged semiconductor device. Further, the leadframe, semiconductor chip, and wire bonds are enclosed within, for example, an epoxy encapsulate that forms at least a portion of a package structure. Although the description and Figures describe wire bonding, embodiments are not limited to wire bonding and may be used with other ways of electrically connecting the semiconductor chip to the leadframe. Additionally, embodiments may be implemented of wafer level chip scale packaging, as described more fully in FIGS. 9A, 9B, and 10, or on a flip chip assembly. Although, leaded and through-hole technology has used single inline packages, there are no known single inline no-leads packages.

Figure 2B:
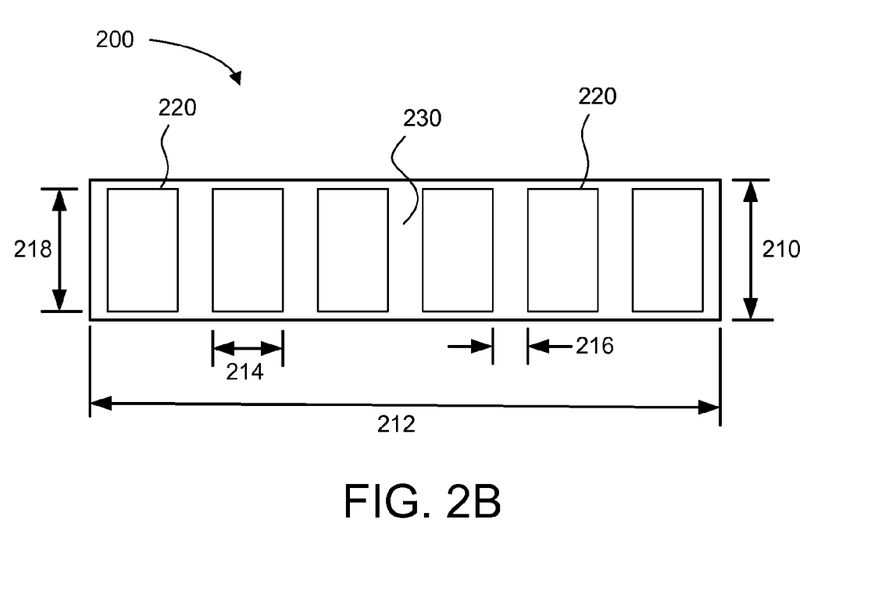
FIG. 2B depicts an embodiment of the bottom surface of six pad leadless package structure similar to FIG. 2A.

The width of the package 200 may also be limited by the width of the semiconductor chip 202. This may necessitate the use of a rectangular chip as opposed to a square chip. The die size may be elongated to allow the width to decrease. Examples of die sizes are 0.2 mm by 0.045 mm, or 0.3 mm by 0.3 mm FIG. 2B depicts an embodiment of the bottom surface 230 of six pad leadless package structure 200 similar to FIG. 2A. In the illustrated embodiment, the leadless package structure 200 defines a rectangular bottom boundary with six rectangular pads 220 exposed on the bottom surface 230 of the leadless package structure 200. The footprint of the package 200 is determined by the width 210 and the length 212 of the package 200.

Figure 2C:
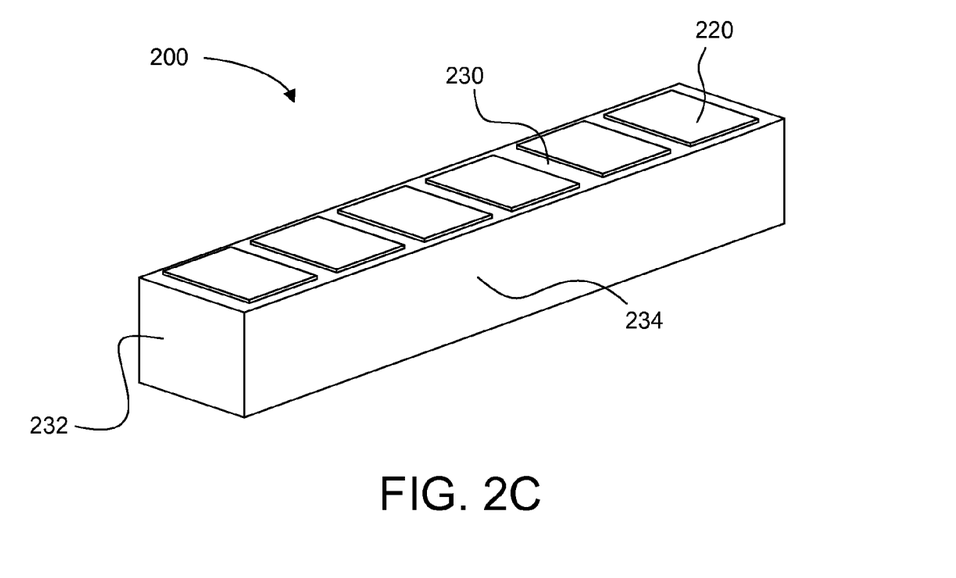
FIG. 2C depicts a bottom perspective view of the six pad leadless package structure of FIG. 2B.

FIG. 2C depicts a bottom perspective view of the six pad leadless package structure 200 of FIG. 2B. The perspective view of the leadless package structure 200 shows a bottom surface 230 and two side surfaces 232-234, an end side surface 232 and a length side surface 234. FIG. 2C also illustrates that the pads 220 may protrude from a plane defined by the bottom surface 230 of the package structure 200. For example, the pads may protrude up to 20 micrometers from the bottom major surface of the package structure. In other embodiments, the pads do not protrude from the bottom surface of the package structure, e.g., the pads are flush with the bottom surface of the package structure.

Figure 3A:
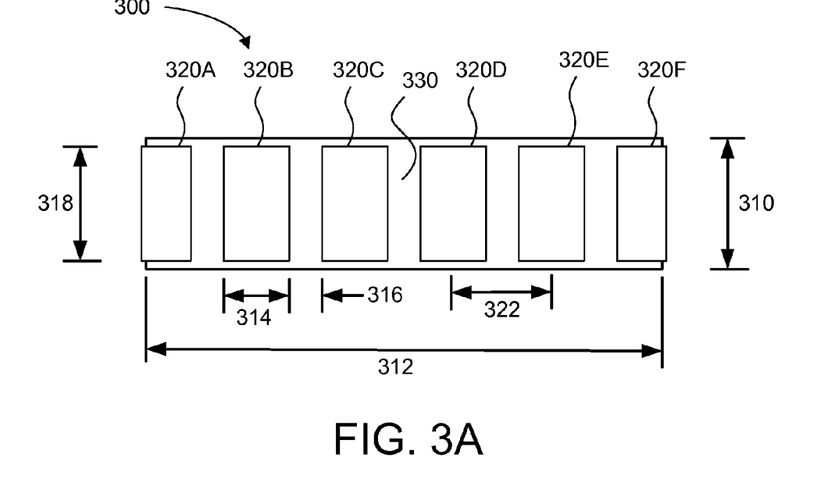
FIG. 3A depicts an embodiment of the bottom surface of six pad leadless package structure with the two end pads being side wettable.

FIG. 3A depicts an embodiment of the bottom surface 330 of six pad leadless package structure 300 with the two end pads 320A and 320F being side wettable. In the embodiment of FIG. 3A, the length 312 of the leadless package structure 300 is affected by the length 314 of the pads 320A-320F, the number of pads 320, and the separation distance 316 or pitch 322 between the pads 320. The overall length 312 may be decreased with side wettable pads 320A and 320F.

Figure 3B:
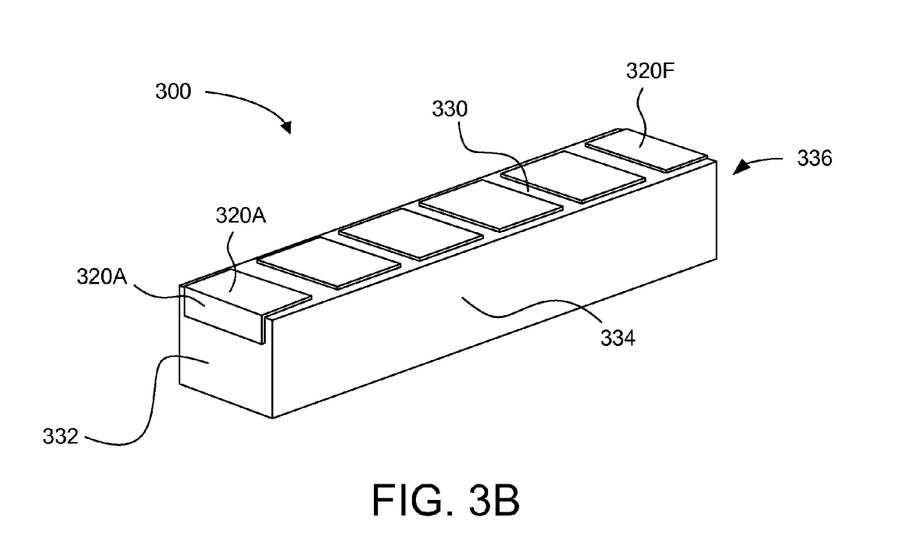
FIG. 3B depicts a bottom perspective view of the six pad leadless package structure of FIG. 3A showing the end pad exposed on the end side surface.

FIG. 3B depicts a bottom perspective view of the six pad leadless package structure 300 of FIG. 3A showing the end pad 320A exposed on the end side surface 332, the end side surface 332 being adjacent to the bottom surface 330. The end pad 320F is exposed on the end side surface 336 hidden from view. FIG. 3B also illustrates that the pads 320A-320F may protrude from a plane defined by the bottom surface 330 of the package structure 300. Additionally, the pad 320A may protrude from a plane defined by the end side surface 332 of the package structure 300. The pad 320F may protrude likewise from a plane defined by the end side surface 336. For example, the pads may protrude up to 20 micrometers from the bottom major surface and the end side surfaces of the package structure. In other embodiments, the pads do not protrude from the bottom surface or the end side surfaces of the package structure, e.g., the pads are flush with the bottom surface of the package structure. In some embodiments, the pads may protrude on the bottom surface but not the end side surfaces. In some embodiments, the pads may protrude on the end side surfaces but not the bottom surface.

Figure 4A:
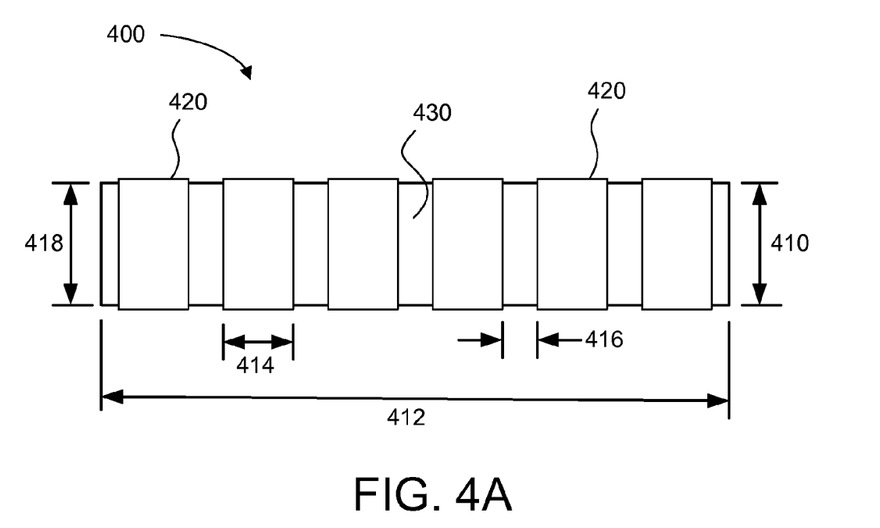
FIG. 4A depicts an embodiment of the bottom surface of six pad leadless package structure with each of the pads being side wettable along the length side surfaces.

FIG. 4A depicts an embodiment of the bottom surface 430 of six pad leadless package structure 400 with each of the pads 420 being side wettable along the length side surfaces. The width 410 of the package 400 is equal to the width 418 of the pads 420. The width 410 of the package 400 may be reduced to the size of a single pad 420 or the size of the pad 420 may be increased to enable a more reliable connection. When each and every pad 420 of the leadless package 400 is exposed on a side surface of the leadless package 400, it allows for easier inspection of the mounting of the leadless package structure 400 to a printed circuit board. The inspection would only require looking at a single side 434 of the leadless package structure 400. When each pad 420 is side wettable on two sides of the package 400, the leadless package 400 would allow for inspection of each pad 420 on more than one side.

Figure 4B:
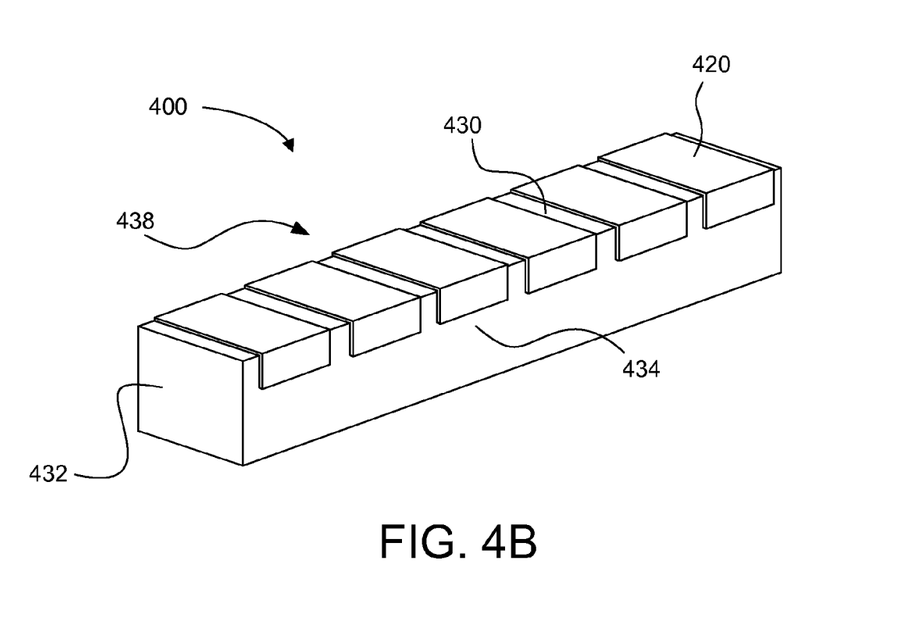
FIG. 4B depicts a bottom perspective view of the six pad leadless package structure of FIG. 4A showing the pads exposed on a length side surface.

FIG. 4B depicts a bottom perspective view of the six pad leadless package structure 400 of FIG. 4A showing the pads 420 exposed on a length side surface 434. Each of the pads 420 are also exposed on the length side surface 438 hidden from view. FIG. 4B also illustrates that the pads 420 may protrude from a plane defined by the bottom surface 430 of the package structure 400. Additionally, the pads 420 may protrude from a plane defined by the length side surface 434 of the package structure 400. The pads 420 may protrude likewise from a plane defined by the length side surface 438. For example, the pads may protrude up to 20 micrometers from the bottom major surface and the length side surfaces of the package structure. In other embodiments, the pads do not protrude from the bottom surface or the length side surfaces of the package structure, e.g., the pads are flush with the bottom surface of the package structure. In some embodiments, the pads may protrude on the bottom surface but not the length side surfaces. In some embodiments, the pads may protrude on the length side surfaces but not the bottom surface.

Figure 5A:
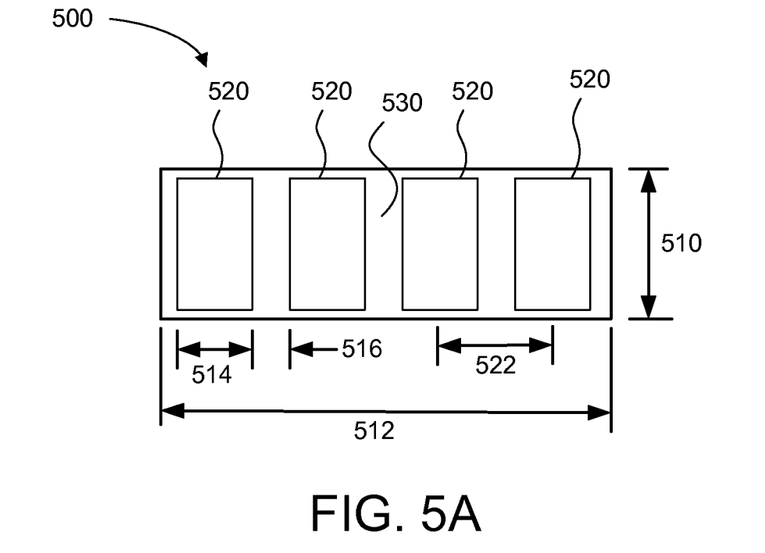
FIG. 5A depicts a plan view of the bottom surface of a four pad leadless package structure with dimensions.

FIG. 5A depicts a plan view of the bottom surface 530 of a four pad leadless package structure 500 with dimensions. The leadless package has four rectangular pads 520A-520D in a single inline row on the bottom surface 530, devoid of any pads outside of the single inline row. The overall width 510 of the bottom surface 530 of the leadless package 500 is approximately 0.45 mm. The overall length 512 of the bottom surface 530 of the leadless package 500 is approximately 1.3 mm with a pitch 522 of 0.35 mm.

Figure 5B:
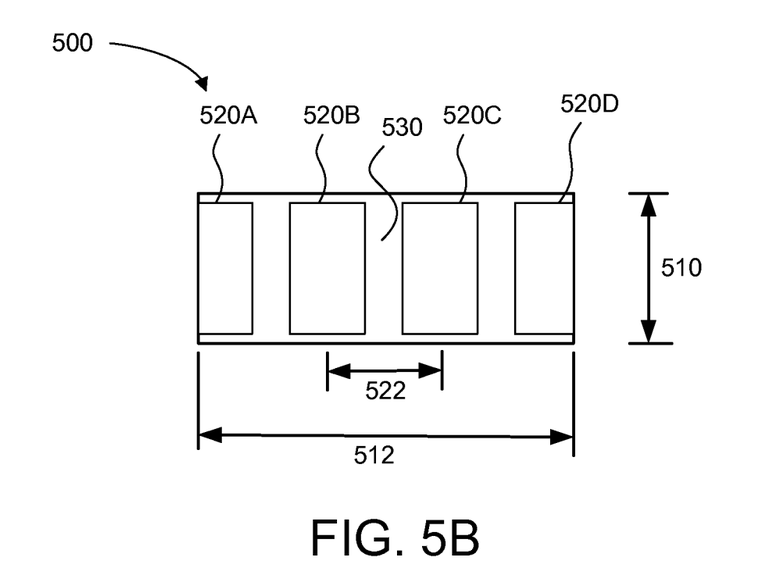
FIG. 5B depicts a plan view of the bottom surface of a four pad leadless package structure with the two end pads side wettable on the end side surfaces.

FIG. 5B depicts a plan view of the bottom surface 530 of a four pad leadless package structure 500 with the two end pads 520A and 520D side wettable on the end side surfaces of the leadless package 500. The overall width 510 of the bottom surface 530 is approximately 0.45 mm. The overall length 512 of the bottom surface 530 is approximately 1.15 mm.

Figure 5C:
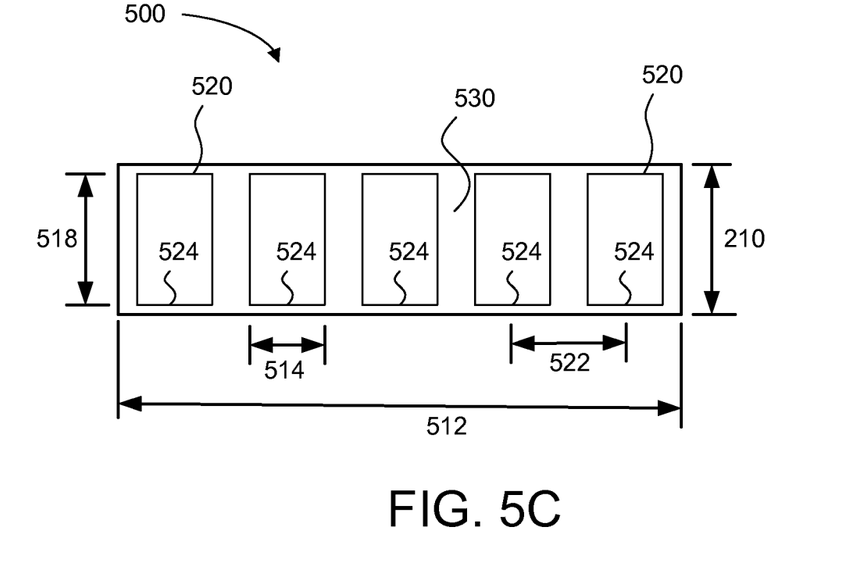
FIG. 5C depicts a plan view of the bottom surface of a five pad leadless package structure with dimensions.

FIG. 5C depicts a plan view of the bottom surface 530 of a five pad leadless package structure 500 with dimensions. The leadless package has five rectangular pads 520 in a single inline row. The overall width 510 of the bottom surface 530 is approximately 0.45 mm. The overall length 512 of the bottom surface 530 is approximately 1.65 mm with a pitch 522 of 0.35 mm. In the illustrated embodiment, the outer edges 524 of each of the pads 520 are collinear.

Figure 5D:
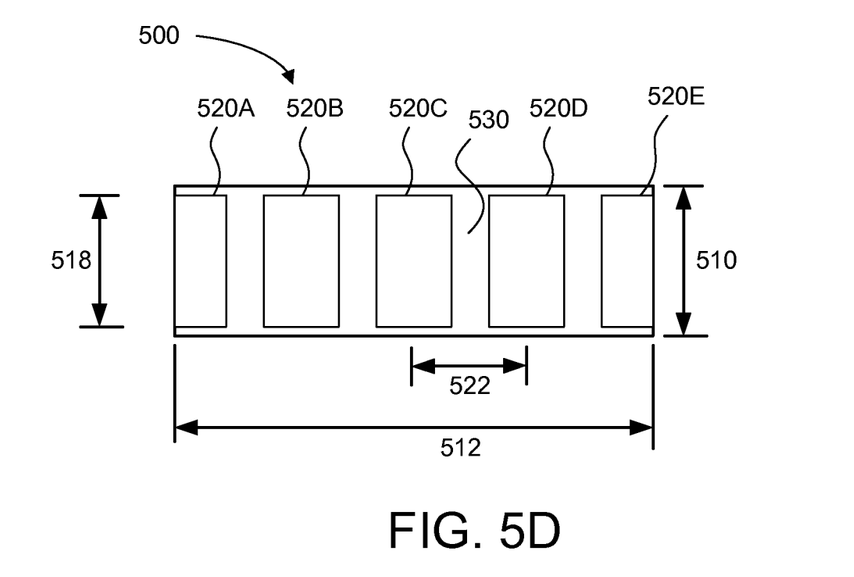
FIG. 5D depicts a plan view of the bottom surface of a five pad leadless package structure with the two end pads side wettable on the end side surfaces.

FIG. 5D depicts a plan view of the bottom surface 530 of a five pad leadless package structure 500 with the two end pads 520A and 520E side wettable on the end side surfaces of the leadless package 500. The overall width 510 of the bottom surface 530 is approximately 0.45 mm. The overall length 512 of the bottom surface 530 is approximately 1.5 mm with a pitch 522 of 0.35 mm.

Figure 5E:
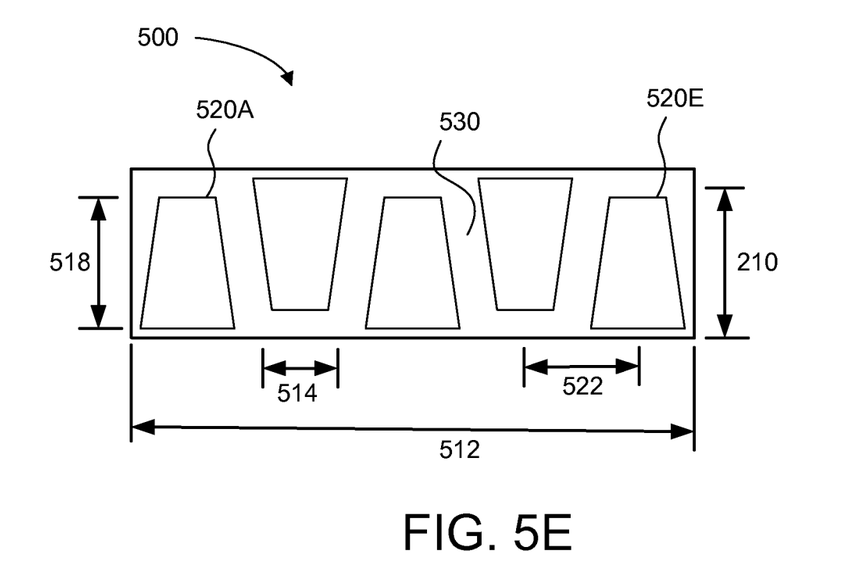
FIG. 5E depicts a plan view of the bottom surface of a five pad leadless package structure with trapezoidal pads.

FIG. 5E depicts a plan view of the bottom surface 530 of a five pad leadless package structure with trapezoidal pads 520 located in a single inline row. The overall width 510 of the bottom surface 530 is approximately 0.5 mm. The overall length 512 of the bottom surface 530 is approximately 1.5 mm. In the illustrated embodiment, the pads 520 are located in a single inline row, where each of the pads is located along a line, the line being defined as a line running through the geometric center or centroid of the end pad 520A and crossing the surface of each other pad 520.

Figure 5F:
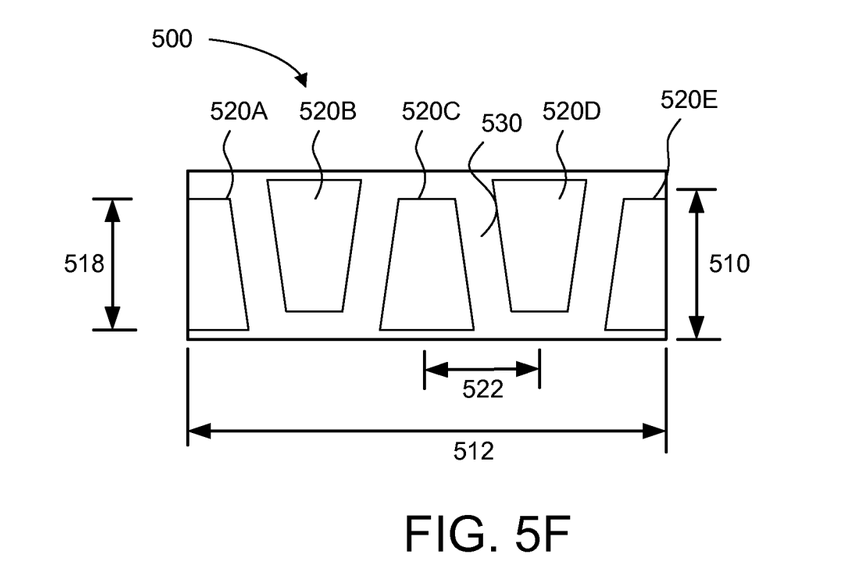
FIG. 5F depicts a plan view of the bottom surface of a five pad leadless package structure with trapezoidal pads and with the two end pads side wettable on the end side surfaces.

FIG. 5F depicts a plan view of the bottom surface 530 of a five pad leadless package structure 500 with trapezoidal pads 520 and with the two end pads 520A and 520B side wettable on the end side surfaces of the leadless package structure 500.

The use of single inline leadless packages reduces the occupied area on a circuit board. For example, the package shown in FIG. 5A has package dimensions of 0.45 mm×1.3 mm, which equals a package area of approximately 0.59 mm$^2$ The package occupies a board area of approximately 0.98 mm$^2$ or 0.7 mm×1.4 mm. By comparison, a comparable four terminal two dimensional array occupies a board area of approximately 1.2 mm$^2$ or 1 mm×1.2 mm. The package shown in FIG. 5B saves an even larger amount of board space/area than the comparable four terminal two dimensional array. The package shown in FIG. 5B has package dimensions of 0.45 mm×1.15 mm, which equals a package area of approximately 0.59 mm$^2$ The package occupies a board area of approximately 0.91 mm$^2$ or 0.7 mm×1.3 mm.

In another example, the package shown in FIG. 5C has package dimensions of 0.45 mm×1.65 mm, which equals a package area of approximately 0.74 mm$^2$ The package occupies a board area of approximately 1.22 mm$^2$ or 0.7×1.75 mm. The package shown in FIG. 5D saves an even larger amount of board space over conventional two dimensional arrays, occupying a board area of approximately 1.16 mm$^2$ or 0.7 mm×1.65 mm. The package shown in FIG. 5D has package dimensions of 0.45 mm×1.5 mm, which equals a package area of approximately 0.68 mm$^2$ By comparison, a comparable two by three array has package dimensions of approximately 1 mm×1 mm. With packages using an odd number of single inline terminals, the space saving occurs with use of the single inline row and is further reduced by removing the unnecessary extra terminal from a conventional two by three array.

In another example, a six terminal, two by three array has package dimensions of 1 mm×1 mm. By utilizing a single inline row of terminals the package dimensions are 0.45 mm×2 mm, reducing the overall footprint of the package.

Figure 6:
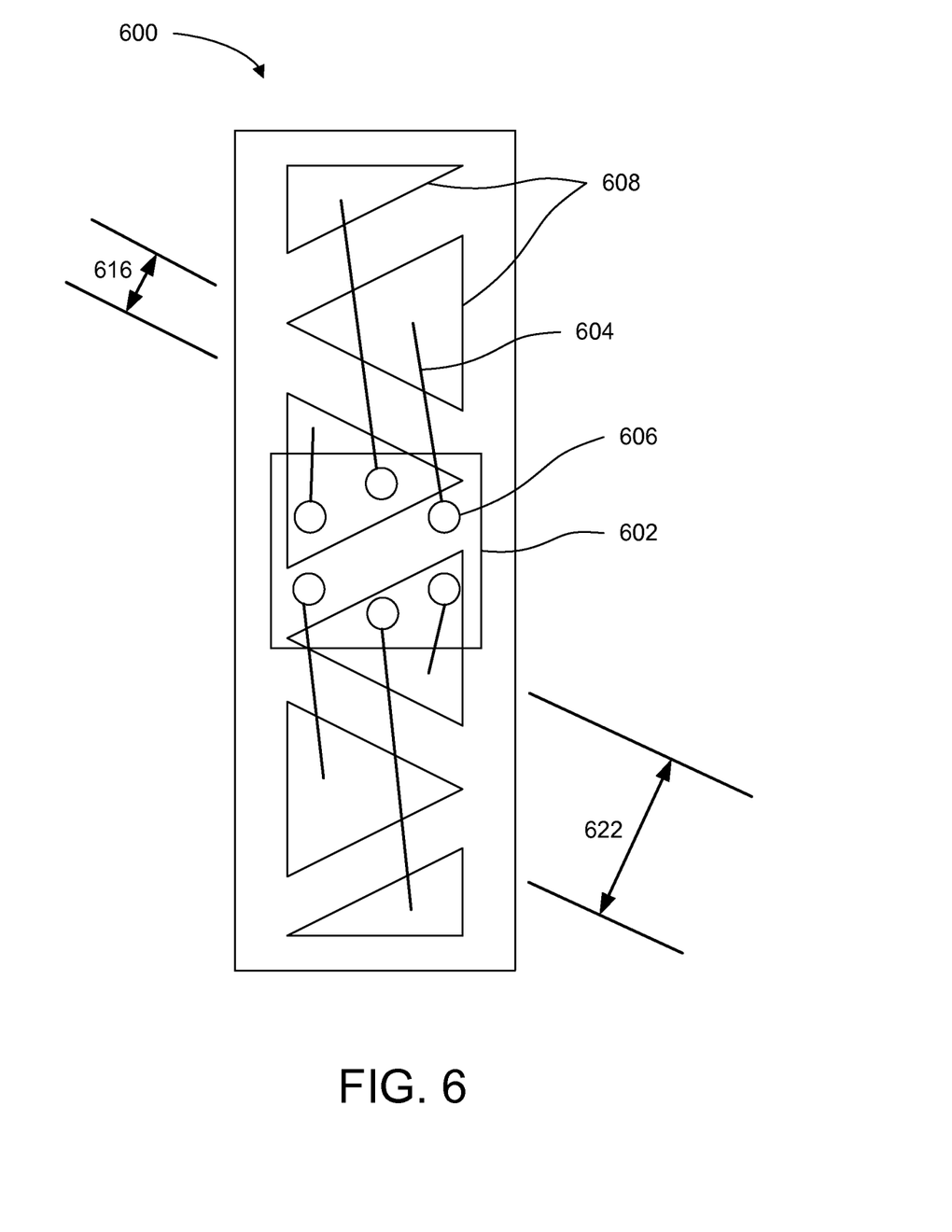
FIG. 6 depicts a six pad single inline leadless package with a semiconductor chip and conductive wires connecting the conductive pads of the semiconductor chip and triangular pads.

FIG. 6 depicts a six pad single inline leadless package 600 with a semiconductor chip 602 and conductive wires 604 connecting the conductive pads 606 of the semiconductor chip 602, the pads being triangular pads 608. The shape of the pads 608 allow for an optimization of the overall surface area of the pads 608 and the separation distance 616 or pitch 622. In the illustrated embodiment, the pads 608 are aligned and corresponding exposed pads will be aligned in a similar manner. In an embodiment, the side edges and vertices of alternating triangular pads are aligned. In an embodiment, the triangular pads are staggered in a manner similar to the pads shown in FIGS. 5E and 5F. In an embodiment, each triangular pad has a side parallel to the side of an adjacent triangular pad. In an embodiment, the sides of adjacent triangular pads are not parallel. Although the interior triangular pads of FIG. 6 are equilateral triangles, other shapes are possible.

Figure 7:
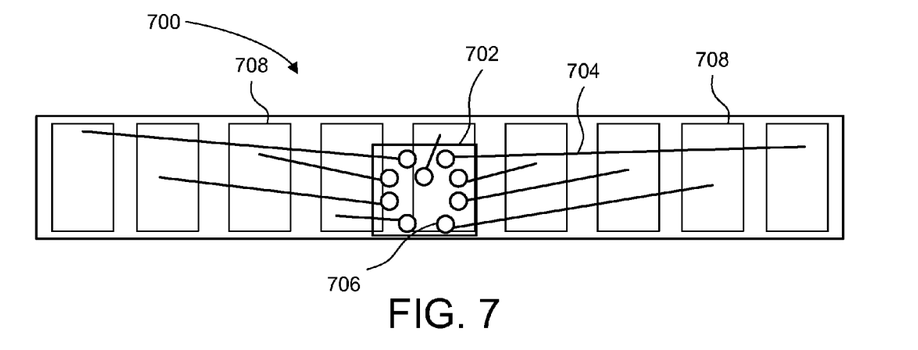
FIG. 7 depicts a nine pad single inline leadless package with a semiconductor chip and conductive wires connecting the conductive pads of the semiconductor chip.

FIG. 7 depicts a nine pad single inline leadless package 700 with a semiconductor chip 702 and conductive wires 704 connecting the conductive pads 706 of the semiconductor chip 702 to the leadframe. The leadless package 700 has nine pads 708 in a single inline row. It may be that circuit board level reliability diminishes with higher terminal counts, which may limit the number of terminals in a single inline leadless semiconductor package.

Figure 8A:
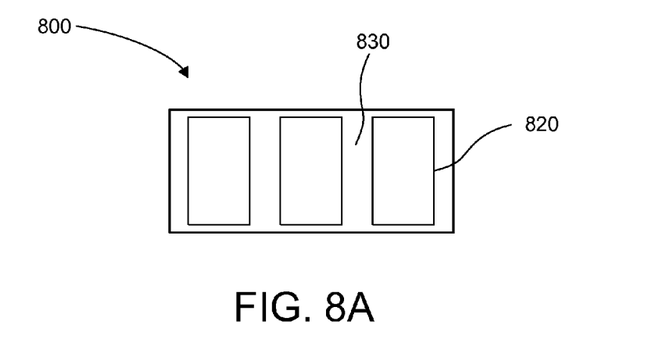
FIG. 8A depicts an embodiment of the bottom surface of a single inline three pad leadless package structure.

FIG. 8A depicts an embodiment of the bottom surface 830 of a single inline three pad leadless package structure 800. In the illustrated embodiment, the leadless package structure 800 defines a rectangular bottom boundary with three rectangular pads 820 exposed on the bottom surface 830 of the leadless package structure 800. The leadless package 800 is suitable for transistor applications. In some embodiments, a leadless package structure includes a plurality of three or more pads exposed at the bottom surface of the package structure. In some embodiments, a leadless package structure includes a plurality of four or more pads exposed at the bottom surface of the package structure.

Figure 8B:
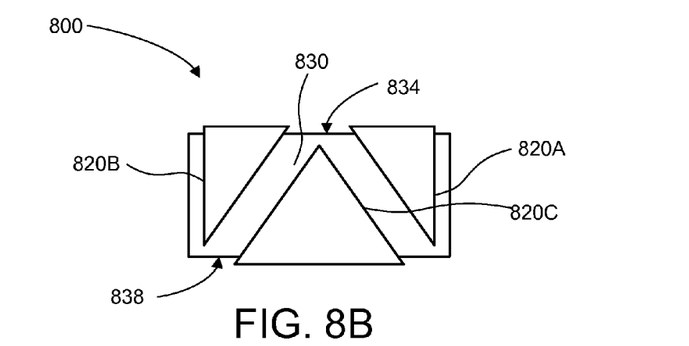
FIG. 8B depicts an embodiment of the bottom surface of a three pad single inline leadless package structure with each of the pads being side wettable along one of the length side surfaces.

FIG. 8B depicts an embodiment of the bottom surface 830 of a three pad single inline leadless package structure 800 with each of the pads 820 being side wettable along one of the length side surfaces. The illustrated embodiment is side wettable in a manner similar to what is described and shown in FIGS. 3A-3B and 4A-4B. The two end pads 820A and 820B are side wettable on a length side surface 834. The center pad 820C is side wettable on a length side surface 838.

Figure 9A:
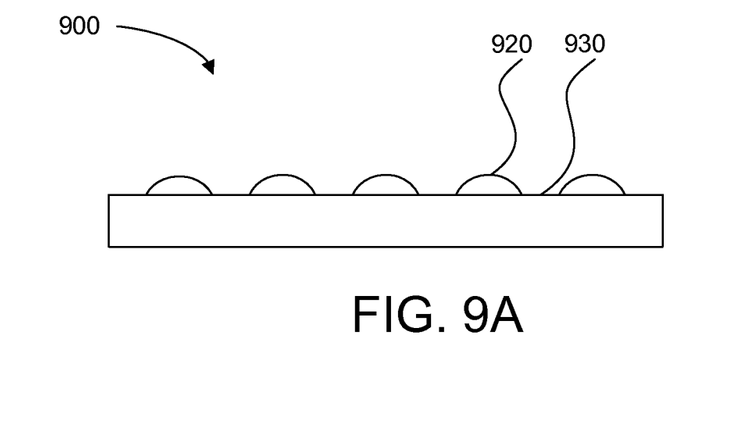
FIGS. 9A and 9B depict a wafer-level chip scale packaging single inline leadless package structure with five CuSn plated pads.
Figure 9B:
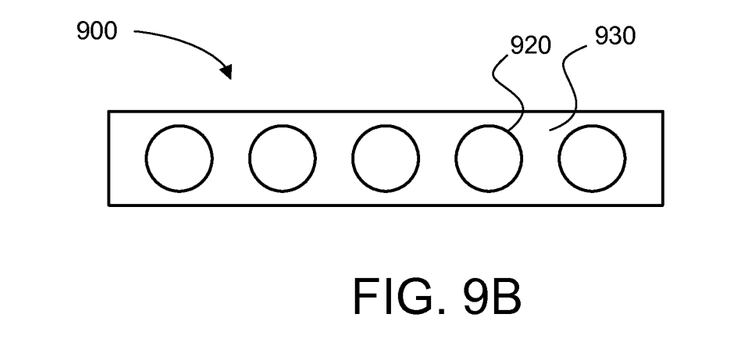

FIGS. 9A and 9B depict a wafer-level chip scale packaging single inline leadless package structure 900 with five CuSn plated pads 920. FIG. 9A is a side view and FIG. 9B is a bottom view of the package structure 900. Some embodiments may be implemented on wafer level chip scale packages. The illustrated embodiment includes five CuSn plated pads 920 on the bottom surface 930 of the package structure. The five CuSn plated pads 920 are located in a single inline row. The package structure is a silicon based product. The manufacture of WLCSP is known and not described in detail herein for the sake of brevity.

Figure 10:
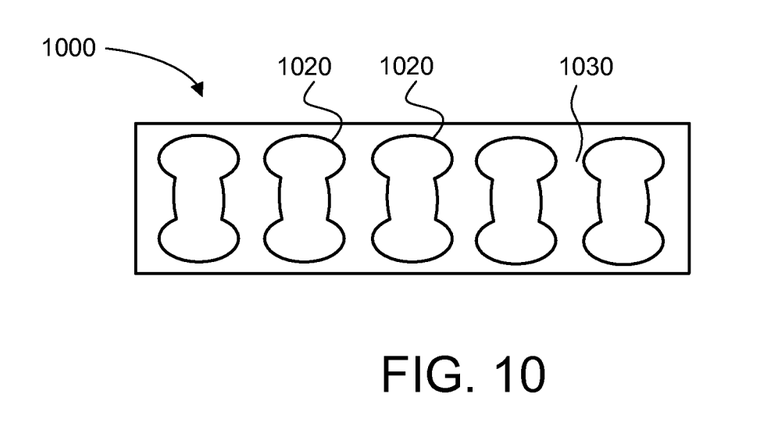
FIG. 10 depicts a perspective view of a wafer-level chip scale packaging single inline leadless package structure with five solder plated pads in a dog-bone shape.

FIG. 10 depict another embodiment of a wafer-level chip scale packaging single inline leadless package structure 1000 with five solder plated pads 1020 in a dog-bone shape. In the illustrated embodiment the pads 1020 are each a dog-bone shape (e.g., wider at each end of the pad than in the middle of the pad). The five solder plated pads 1020 are located in a single inline row on the bottom surface 1030 of the package structure. Although FIG. 10 depicts a dog-bone shape, alternative shapes are envisioned. Additionally, although five solder plated pads are shown, a different number of pads ranging from, for example, three to nine, is possible.

In the embodiments described above, the pads are electrically connected to electrically conductive pins of the packaged semiconductor device as either ground, Vcc, or input/output pads. Although the above-described layouts include packaged semiconductor devices with three, four, five, six, and nine exposed pads, packaged semiconductor devices with other numbers of exposed pads are possible and contemplated. Although the pads are described in a limited amount of shapes, embodiments are not limited to those shapes and other shaped pads are possible. The shape of the pads may be optimized to allow for sufficient separation distance between pads and maximum area of pads for reliable connections. Further, although certain dimensions are provided, other dimensions of any of the elements of the flat no-lead packaged semiconductor devices are possible. Additionally, although certain dimensions are noted, in some embodiments, the dimensions may vary within certain tolerances as are known in the field. As used herein, pitch represents the distance between pads and may be measured from edge to edge of the pads or center to center of pads.

Although the majority of embodiments described herein show the outer edges of the pads aligned, the pads may be staggered along a single inline row. An inline row of pads will overlap so as to allow a single straight line to be drawn over all the pads. In some embodiments, the outer edges of each pad will be aligned.

In an embodiment, a monolithic leadframe structure is utilized to form the leadframe that connects directly to the semiconductor chip and to form the pads. In an embodiment, the leadframe is formed by etching the leadframe from the top side and from the bottom side to generate a different layout on the top side and the bottom side of the leadframe.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A semiconductor device comprising:
  a semiconductor chip;
  a leadless package structure defining a boundary and having a bottom surface, the leadless package structure comprising:
  three or more pads exposed at the bottom surface of the package structure, each of the pads being located in a single inline row;
  the leadless package structure defining a rectangular boundary, wherein a width of the package structure is limited to a width of each of the three or more pads.

2. The semiconductor device of claim 1, the leadless package structure having two length side surfaces, wherein the two length side surfaces are adjacent to the bottom surface, wherein each of the three or more pads is side wettable, wherein each of the three or more pads is exposed on a first length side surface of the leadless package.

3. The semiconductor device of claim 1, the leadless package structure having two length side surfaces, wherein the two length side surfaces are adjacent to the bottom surface, wherein each of the three or more pads is side wettable on two sides of each of the three or more pads, wherein each of the three or more pads is exposed on a first length side surface of the leadless package and a second length side surface of the leadless package.

4. The semiconductor device of claim 1, the leadless package structure having two end side surfaces, wherein the two end side surfaces are adjacent to the bottom surface, wherein a first pad on a first end of the single inline row is side wettable, wherein the first pad is exposed on a first end side surface of the leadless package.

5. The semiconductor device of claim 1, the leadless package structure having two end side surfaces, wherein the two end side surfaces are adjacent to the bottom surface, wherein a first pad on a first end of the single inline row is side wettable, wherein the first pad is exposed on a first end side surface of the leadless package, and wherein a second pad on a second end of the single inline row is side wettable, wherein the second pad is exposed on a second end side surface opposite the first end side surface.

6. The semiconductor device of claim 1, wherein the three or more pads are polygonal pads.

7. The semiconductor device of claim 1, wherein each of the three or more pads is a polygonal pad, wherein at least one of the polygonal pads is rectangular.

8. The semiconductor device of claim 1, wherein each of the three or more pads is a polygonal pad, wherein at least one of the polygonal pads is triangular.

9. The semiconductor device of claim 1, wherein each of the three or more pads is a polygonal pad, wherein at least one of the polygonal pads is a trapezoid.

10. The semiconductor device of claim 1, wherein each of the three or more pads is a polygonal pad, wherein each of the three or more polygonal pads are located along a first line along the bottom surface of the package structure, wherein the first line is defined as a line running through a geometric center of a first polygonal pad.

11. The semiconductor device of claim 1, wherein outer edges of the three or more pads are polygonal pads that are collinear.

12. The semiconductor device of claim 1, wherein a pitch of each of the three or more pads occurs only in a single direction.

13. The semiconductor device of claim 1, wherein the package structure defining a boundary is plastic, wherein the plastic package structure encapsulates the semiconductor chip.

14. The semiconductor device of claim 1, wherein the package structure comprises silicon.

15. The semiconductor device of claim 1, wherein the package structure is a wafer level chip scale package, wherein the package structure comprises silicon, and wherein the pads are solder plated.

16. The semiconductor device of claim 1, wherein the package structure is a wafer level chip scale package, wherein the package structure comprises silicon, wherein the pads are solder plated, wherein the pads comprise a dog-bone shape.

17. The semiconductor device of claim 1, wherein the package structure comprises silicon, wherein the three or more pads exposed at the bottom surface of the package structure are CuSn plated.

18. A semiconductor device comprising:
a semiconductor chip;
a package structure comprising no leads and defining a boundary and having a bottom surface, the bottom surface defining a rectangular boundary, the package structure comprising:
a single inline row of three or more pads exposed at the bottom surface of the package structure in the absence of other pads not in the single row.

19. A semiconductor device comprising:
a semiconductor chip;
a leadless package structure defining a boundary and having a bottom surface, the leadless package structure comprising:
three or more pads exposed at the bottom surface of the package structure, each of the pads being located in a single inline row;
the leadless package structure having two length side surfaces, wherein the two length side surfaces are adjacent to the bottom surface, wherein each of the three or more pads is side wettable on two sides of each of the three or more pads, wherein each of the three or more pads is exposed on a first length side surface of the leadless package and a second length side surface of the leadless package.

* * * * *